(12) United States Patent
Lian et al.

(10) Patent No.: US 12,216,156 B2
(45) Date of Patent: Feb. 4, 2025

(54) CHIP TEST PRESSING-DOWN APPARATUS AND FORMATION METHOD THEREOF

(71) Applicant: SEMIGHT INSTRUMENTS CO., LTD, Suzhou (CN)

(72) Inventors: Zhe Lian, Suzhou (CN); Jianjun Huang, Suzhou (CN); Yonghong Wu, Suzhou (CN); Shan Zhao, Suzhou (CN); Haiyang Hu, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 0 days.

(21) Appl. No.: 18/432,968

(22) Filed: Feb. 5, 2024

(65) Prior Publication Data
US 2024/0410935 A1    Dec. 12, 2024

Related U.S. Application Data

(63) Continuation of application No. PCT/CN2023/134146, filed on Nov. 24, 2023.

(30) Foreign Application Priority Data

Jun. 6, 2023  (CN) .......................... 202321421438.8

(51) Int. Cl.
*G01R 1/02*  (2006.01)
*G01R 1/04*  (2006.01)
(Continued)

(52) U.S. Cl.
CPC .......... *G01R 31/2886* (2013.01); *G01R 3/00* (2013.01)

(58) Field of Classification Search
CPC . G01R 1/02; G01R 1/04; G01R 1/067; G01R 1/073; G01R 3/00; G01R 31/02;
(Continued)

(56) References Cited

U.S. PATENT DOCUMENTS 5,647,756 A  *  7/1997  Twigg .................. G01R 1/0433
                                                              439/73
2020/0081060 A1    3/2020  Ouyang et al.

FOREIGN PATENT DOCUMENTS

CN          101236229 A         8/2008
CN          207926808     *     9/2018 ............. H04N 17/00
(Continued)

*Primary Examiner* — Neel D Shah
(74) *Attorney, Agent, or Firm* — ANOVA LAW GROUP, PLLC

(57) ABSTRACT

The present disclosure includes a die test pressing-down apparatus and a formation method. The die test pressing-down apparatus includes a support frame capable of moving along a vertical direction; and a pressing-down block installed on the support frame. A part to-be-pressed is disposed directly below the pressing-down block. The pressing-down block is connected to the support frame through an installation plate; a strip-shaped through hole is formed at an upper surface of the support frame; a first protruding strip is at each lower portion of two opposite inner walls of the strip-shaped through hole; a corresponding second protruding strip is at each upper portion of two opposite side surfaces of the installation plate; and a side of a strip-shaped block is fixedly connected to the upper surface of the support frame, and another side of the strip-shaped block is connected to the second protruding strip through at least two springs.

7 Claims, 5 Drawing Sheets

(51) Int. Cl.
*G01R 1/067* (2006.01)
*G01R 1/073* (2006.01)
*G01R 3/00* (2006.01)
*G01R 31/26* (2020.01)
*G01R 31/28* (2006.01)

(58) Field of Classification Search
CPC .... G01R 31/26; G01R 31/28; G01R 31/2886; G01R 31/69
See application file for complete search history.

(56) References Cited

FOREIGN PATENT DOCUMENTS

| | | |
|---|---|---|
| CN | 208044017 U | 11/2018 |
| CN | 209624724 U | 11/2019 |
| CN | 113917316 A | 1/2022 |

* cited by examiner

CHIP TEST PRESSING-DOWN APPARATUS AND FORMATION METHOD THEREOF

CROSS-REFERENCE TO RELATED APPLICATION

This application is a continuation application of PCT/CN2023/134146, filed on Nov. 24, 2023, which claims the priority of Chinese Patent Application No. 202321421438.8, filed on Jun. 6, 2023, the entirety of all of which is incorporated herein by reference.

TECHNICAL FIELD

The present disclosure generally relates to the field of semiconductor die testing technology and, more particularly, relates to a die test pressing-down apparatus and a formation method thereof.

BACKGROUND

A die is a silicon element containing an integrated circuit. With technology development, the structures of the dies become more refined, and the manufacturing processes of the dies become more complex. Dies that do not meet qualification standard may be easily failed. Therefore, in order to ensure the quality of the dies, die testing apparatuses are used to test the dies, thereby improving yield and reliability of the dies.

When the die is tested using an existing die testing apparatus, the die installed on a lower supporting plate may be pressed tightly by an upper cover plate to realize the electrical connection between the die and a spring pin, thereby completing relevant test screening. However, during the process of pressing down the upper cover plate, the mold-closed flatness between the upper cover plate and the lower supporting plate cannot be ensured, thereby affecting test accuracy and test data consistency.

SUMMARY

One aspect of the present disclosure provides a die test pressing-down apparatus. The die test pressing-down apparatus includes a support frame capable of moving along a vertical direction; and a pressing-down block installed on the support frame, where a part to-be-pressed is disposed directly below the pressing-down block. The pressing-down block is connected to the support frame through an installation plate; a strip-shaped through hole is formed at an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs. When the pressing-down block and the part to-be-pressed are spaced apart from each other, a lower surface of the second protruding strip is adjoined to be in a contact with an upper surface of a corresponding first protruding strip; and when a lower surface of the pressing-down block is tightly pressed with an upper surface of the part to-be-pressed, a gap is formed between the lower surface of the second protruding strip and the upper surface of the corresponding first protruding strip.

Optionally, each second protruding strip is connected to the strip-shaped block by a plurality of springs arranged at an equal interval along a length direction of the strip-shaped block.

Optionally, an installation groove for an end portion of a spring to be inserted is formed at an upper surface of the second protruding strip and/or at a lower surface of the strip-shaped block.

Optionally, the strip-shaped through hole is formed at a horizontal portion of the support frame; and a vertical portion of the support frame is installed on a surface of a side of an installation base plate, which is vertically configured, through at least two sets of vertical guiding rails and vertical sliding blocks matched with each other.

Optionally, the horizontal portion of the support frame is at an upper end of the vertical portion and extends to another side of the installation base plate.

Optionally, the pressing-down block and the part to-be-pressed are matched to be connected to each other through at least two sets of pins and pin holes.

Optionally, the pressing-down block is fixedly installed on a lower surface of the installation plate.

Another aspect of the present disclosure provides a formation method of a die test pressing-down apparatus. The formation method includes providing a support frame capable of moving along a vertical direction; and installing a pressing-down block on the support frame, where a part to-be-pressed is disposed directly below the pressing-down block. The pressing-down block is connected to the support frame through an installation plate; a strip-shaped through hole is formed at an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs. When the pressing-down block and the part to-be-pressed are spaced apart from each other, a lower surface of the second protruding strip is adjoined to be in a contact with an upper surface of a corresponding first protruding strip; and when a lower surface of the pressing-down block is tightly pressed with an upper surface of the part to-be-pressed, a gap is formed between the lower surface of the second protruding strip and the upper surface of the corresponding first protruding strip.

Optionally, each second protruding strip is connected to the strip-shaped block by a plurality of springs arranged at an equal interval along a length direction of the strip-shaped block.

Optionally, an installation groove for an end portion of a spring to be inserted is formed at an upper surface of the second protruding strip and/or at a lower surface of the strip-shaped block.

Optionally, the strip-shaped through hole is formed at a horizontal portion of the support frame; and a vertical portion of the support frame is installed on a surface of a side of an installation base plate, which is vertically configured, through at least two sets of vertical guiding rails and vertical sliding blocks matched with each other.

Optionally, the horizontal portion of the support frame is at an upper end of the vertical portion and extends to another side of the installation base plate.

Optionally, the pressing-down block and the part to-be-pressed are matched to be connected to each other through at least two sets of pins and pin holes.

Optionally, the pressing-down block is fixedly installed on a lower surface of the installation plate.

Other aspects of the present disclosure may be understood by those skilled in the art in light of the description, the claims, and the drawings of the present disclosure.

BRIEF DESCRIPTION OF THE DRAWINGS

Accompanying drawings, which are incorporated into a part of the present disclosure, illustrate embodiments of the present disclosure and together with the specification to explain the principle of the present disclosure. With reference to accompanying drawings, some specific embodiments of the present disclosure are described in detail below through a manner of illustration and not-limitation. Same reference numbers in accompanying drawings means same or similar parts or portions. Those skilled in the art should understand that accompanying drawings are not necessarily drawn according to scale.

DETAILED DESCRIPTION

Figure 1:
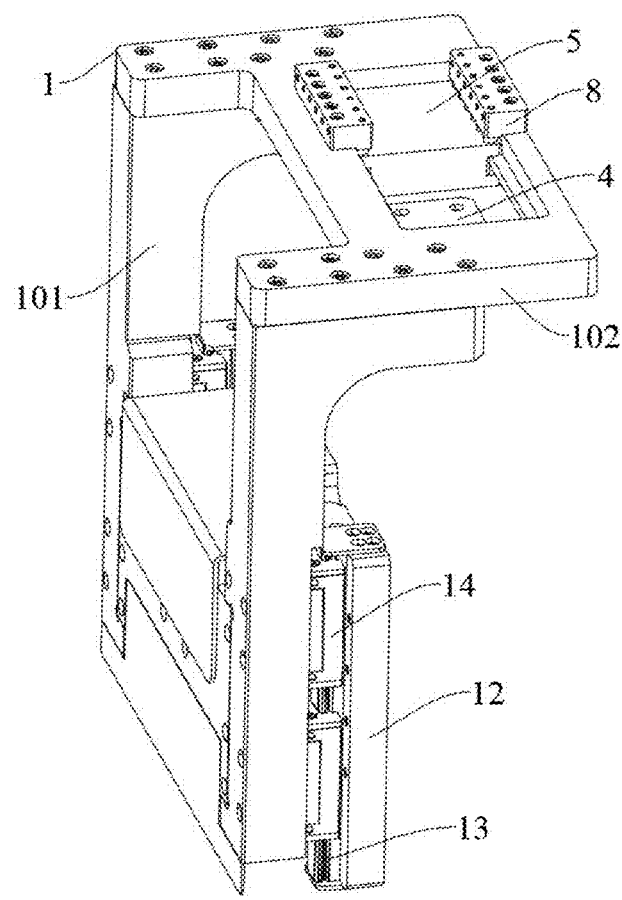
FIG. 1 illustrates an overall structural schematic of a die test pressing-down apparatus according to various embodiments of the present disclosure.

Various exemplary embodiments of the present disclosure are described in detail with reference to accompanying drawings. It should be noted that unless stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters are configured to indicate similar items in following drawings. Therefore, once an item is defined in one drawing, it does not need to be further discussed in subsequent drawings.

The present disclosure can be further clearly understood through the specific examples given below, which may not limited the present disclosure.

A known good die (KGD) is defined as a package type fully supported by suppliers to meet or exceed quality, reliability, and functional data sheet specifications, with non-standardized (die specific) but completely and electronically transferable mechanical specifications. A KGD (known good die) testing apparatus (e.g., KGD testing machine, KGD tester, KGD testing equipment, or KGD test cell) is configured for the die testing before packaging and after splitting. The testing apparatus confirms that dies with desirable performance are used for packaging before high-density packaging, which improves the cumulative packaging yield. The testing apparatus may realize a fully automatic testing system and automatically realize picking, transporting, testing and unloading of dies. The testing apparatus may support multi-station parallel testing. Different stations may support different temperatures and test projects. Different stations may support static, dynamic, and avalanche function tests; and the test sequence may be adjustable. The testing apparatus may support high temperature testing with a temperature range from room temperature to 200° C. The power-on pin card may be a sealed design, support nitrogen filling protection against high-pressure sparking and nitrogen pressure monitoring and support high-temperature preheating and die surface anti-oxidation protection. It should be noted that "chip" and "die" may be interchangeable in the present disclosure.

Figure 2:
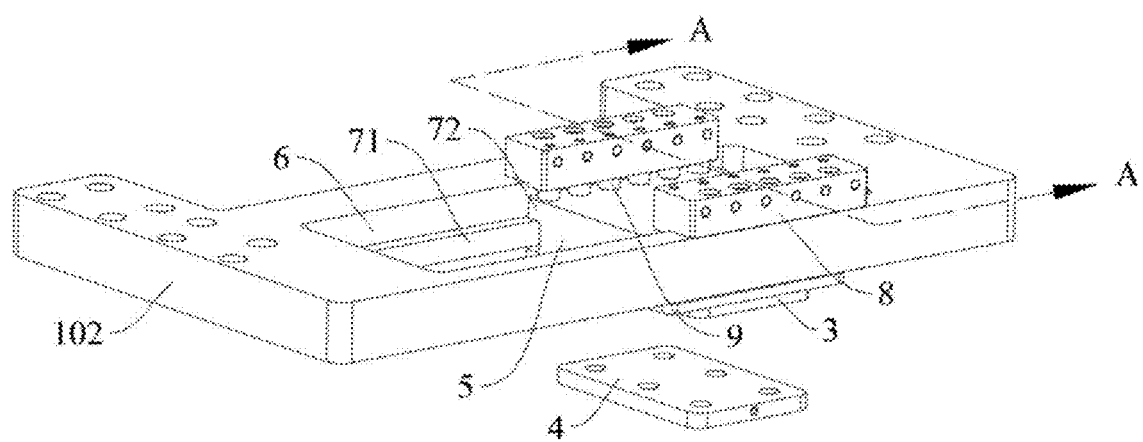
FIG. 2 illustrates a partial structural schematic of a die test pressing-down apparatus according to various embodiments of the present disclosure.
Figure 3:
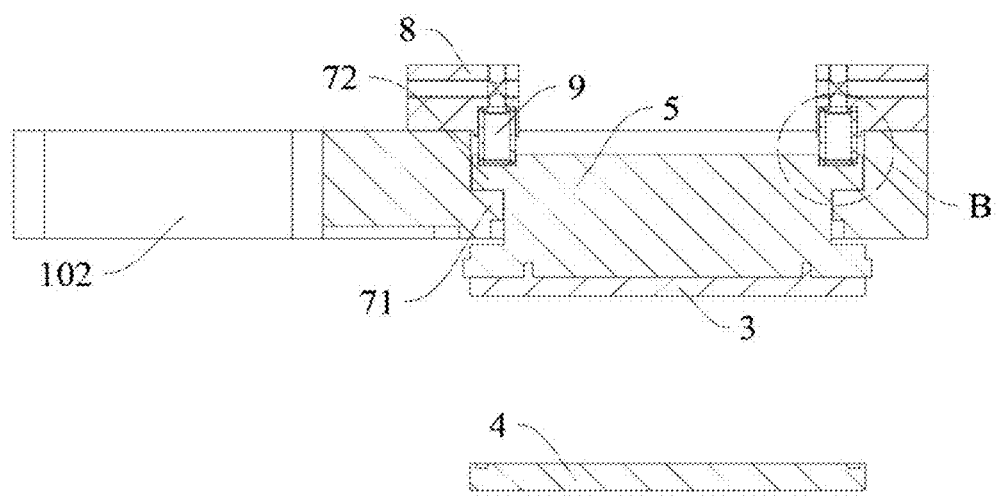
FIG. 3 illustrates a cross-sectional view along an A-A direction in FIG. 2.
Figure 4:
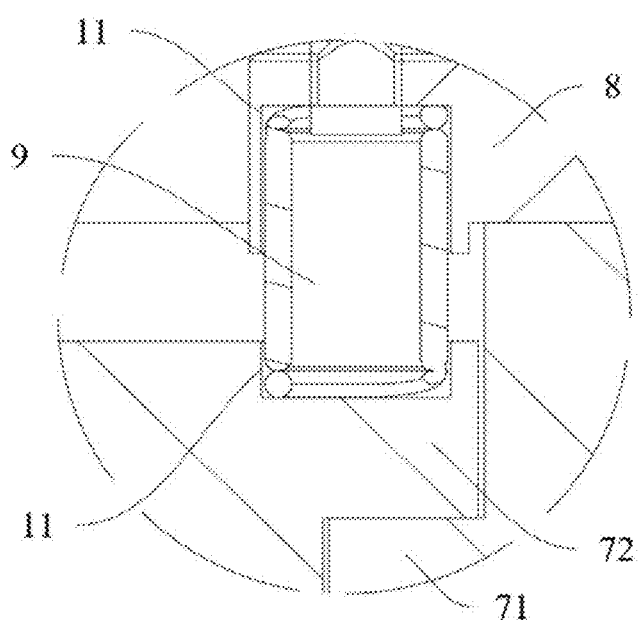
FIG. 4 illustrates an enlarged schematic of a location B in FIG. 3.
Figure 5:
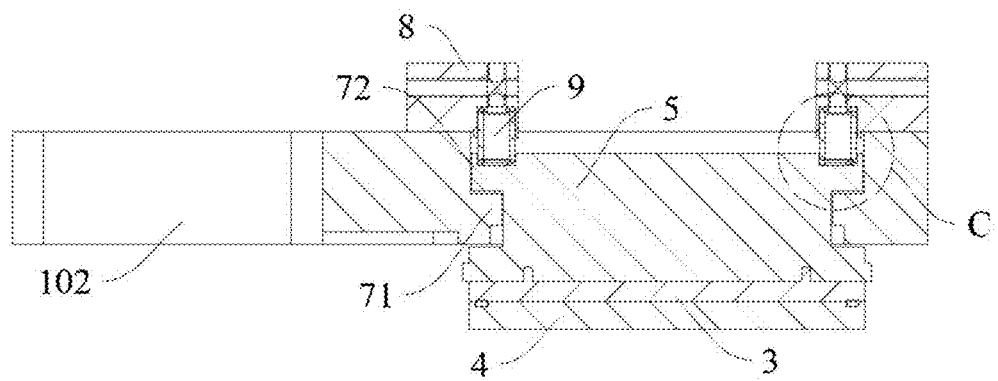
FIG. 5 illustrates a schematic of a mold-closed state of a die test pressing-down apparatus according to various embodiments of the present disclosure.
Figure 6:
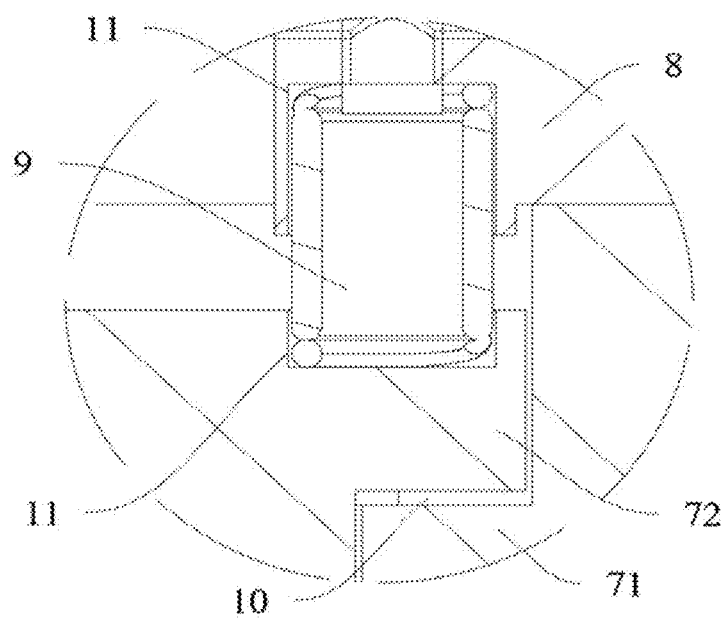
FIG. 6 illustrates an enlarged schematic of a location C in FIG. 5.

Exemplary embodiments are described in the present disclosure with reference to FIGS. 1-6, which are schematics used for describing various, different embodiments. Referring to FIGS. 1-6, FIG. 1 illustrates an overall structural schematic of a die test pressing-down apparatus according to various embodiments of the present disclosure; FIG. 2 illustrates a partial structural schematic of the die test pressing-down apparatus according to various embodiments of the present disclosure; FIG. 3 illustrates a cross-sectional view along an A-A direction in FIG. 2; FIG. 4 illustrates an enlarged schematic of a location B in FIG. 3; FIG. 5 illustrates a schematic of a mold-closed state of the die test pressing-down apparatus according to various embodiments of the present disclosure; and FIG. 6 illustrates an enlarged schematic of a location C in FIG. 5. It should be noted that upper and lower test sockets may form a mold; and the mold may include a mold-closed state, which refers to that a die has been placed in an accommodating chamber, and the upper test socket and the lower test socket are pressed together.

Exemplary Embodiment One

The present disclosure provides a pressing-down apparatus. The pressing-down apparatus may include a support frame 1 capable of moving along a vertical direction and a pressing-down block 3 installed on the support frame 1. A part to-be-pressed 4 may be disposed directly below the pressing-down block 3. The pressing-down block 3 may be connected to the support frame 1 through an installation plate 5. A strip-shaped through hole 6 may be formed on the upper surface of the support frame 1. A first protruding strip 71 may be at each of lower portions of two opposite inner walls of the strip-shaped through hole 6. A corresponding second protruding strip 72 extending directly above the first protruding strip 71 may be at each of upper portions of two opposite side surfaces of the installation plate 5. A strip-shaped block 8 may be disposed above each second protruding strip 72. A side of the strip-shaped block 8 may be fixedly connected to the upper surface of the support frame 1, and another side of the strip-shaped block 8 may extend to directly above the second protruding strip 72 and be connected to the second protruding strip 72 through at least two springs 9. When the pressing-down block 3 and the part to-be-pressed 4 are spaced apart from each other, the lower surface of the second protruding strip 72 may be adjoined to be in contact with the upper surface of corresponding first protruding strip 71. When the lower surface of the pressing-down block 3 is tightly pressed with the upper surface of the part to-be-pressed 4, a gap 10 may be formed between the lower surface of the second protruding strip 72 and the upper surface of the first protruding strip 71.

As the support frame moves downward, the pressing-down block may press the part to-be-pressed and continue to move downward after being in contact with the part to-be-pressed. The part to-be-pressed may apply an upward reaction force to the pressing-down block. Under the reaction force, two second protruding strips on the installation plate may be upwardly separated from the first protruding strips on the support frame, thereby forming a gap between the second protruding strips and the first protruding strips. Moreover, the springs may continuously exert a downward pressing force on two second protruding strips on the installation plate; and the downward pressing force is the mold closing pressing force. At this point, the pressing-down block installed on the installation plate is in a floating state, and it realizes that the plane reference is converted from the pressing-down block to the part to-be-pressed; and the springs may absorb and balance the slight deviation on the horizontal plane, thereby achieving a tight and flat contact or attachment between the pressing-down block and the part to-be-pressed.

In one embodiment, each of above-mentioned second protruding strips 72 may be connected to the strip-shaped block 8 through a plurality of springs 9 (e.g., five springs) arranged at an equal interval along the length direction of the strip-shaped block 8.

In one embodiment, an installation groove 11 for an end portion of the spring 9 to be inserted may be formed at the upper surface of the second protruding strip 72 and/or at the lower surface of the strip-shaped block 8.

In one embodiment, the strip-shaped through hole 6 may be formed at a horizontal portion 102 of the support frame 1. The vertical portion 101 of the support frame 1 may be installed on a surface of a side of an installation base plate 12 vertically arranged through at least two sets of vertical guiding rails 13 and vertical sliding blocks 14 which are matched with each other.

In one embodiment, the horizontal portion 102 of above-mentioned support frame 1 may be at the upper end of the vertical portion 101 and extend to another side of the installation base plate 12.

Exemplary Embodiment Two

The present disclosure provides a die test pressing-down apparatus. The die test pressing-down apparatus may include the support frame 1 capable of moving along the vertical direction and the pressing-down block 3 installed on the support frame 1. The part to-be-pressed 4 may be disposed directly below the pressing-down block 3. The pressing-down block 3 may be connected to the support frame 1 through the installation plate 5. The strip-shaped through hole 6 may be formed on the upper surface of the support frame 1. The first protruding strip 71 may be at each of lower portions of two opposite inner walls of the strip-shaped through hole 6. A corresponding second protruding strip 72 extending directly above the first protruding strip 71 may be at each of upper portions of two opposite side surfaces of the installation plate 5. The strip-shaped block 8 may be disposed above each second protruding strip 72. A side of the strip-shaped block 8 may be fixedly connected to the upper surface of the support frame 1, and another side of the strip-shaped block 8 may extend to directly above the second protruding strip 72 and be connected to the second protruding strip 72 through at least two springs 9. When the pressing-down block 3 and the part to-be-pressed 4 are spaced apart from each other, the lower surface of the second protruding strip 72 may be adjoined to be in contact with the upper surface of corresponding first protruding strip 71. When the lower surface of the pressing-down block 3 is tightly pressed with the upper surface of the part to-be-pressed 4, the gap 10 may be formed between the lower surface of the second protruding strip 72 and the upper surface of the first protruding strip 71.

In one embodiment, each of above-mentioned second protruding strips 72 may be connected to the strip-shaped block 8 through a plurality of springs 9 (e.g., size springs) arranged at an equal interval along the length direction of the strip-shaped block 8.

The springs may absorb small offset while continuously providing mold closing pressing force, thereby ensuring a flat contact or attachment between the pressing-down block and the part to-be-pressed.

In one embodiment, the installation groove 11 for an end portion of the spring 9 to be inserted may be formed at the upper surface of the second protruding strip 72.

In one embodiment, the pressing-down block 3 and the component to-be-pressed 4 may be connected to each other through at least two sets of pins and pin holes.

In one embodiment, the pressing-down block 3 may be fixedly installed on the lower surface of the installation plate 5.

The working principle of the die test pressing-down apparatus is described in detail hereinafter.

As the support frame moves downward, the pressing-down block may press the part to-be-pressed and continue to move downward after being in contact with the part to-be-pressed. The part to-be-pressed may apply an upward reaction force to the pressing-down block. Under the reaction force, two second protruding strips on the installation plate may be upwardly separated from the first protruding strips on the support frame, thereby forming a gap between the second protruding strips and the first protruding strips. Moreover, the springs may continuously exert a downward pressing force on two second protruding strips on the installation plate; and the downward pressing force is the mold closing pressing force. At this point, the pressing-down block installed on the installation plate is in a floating state, and it realizes that the plane reference is converted from the pressing-down block to the part to-be-pressed; and the springs may absorb and balance the slight deviation on the horizontal plane, thereby achieving a tight and flat contact or attachment between the pressing-down block and the part to-be-pressed.

When above-mentioned die test pressing-down apparatus is used, the horizontal reference of the pressing-down block may be converted to the part to-be-pressed after the pressing-down block is molded together with the part to-be-pressed; and the springs may absorb and balance the slight deviation on the horizontal plane, thereby ensuring a flat contact or attachment between the pressing-down block and the part to-be-pressed and further improving the mold closing flatness between the pressing-down block and the part to-be-pressed.

Figure 7A:
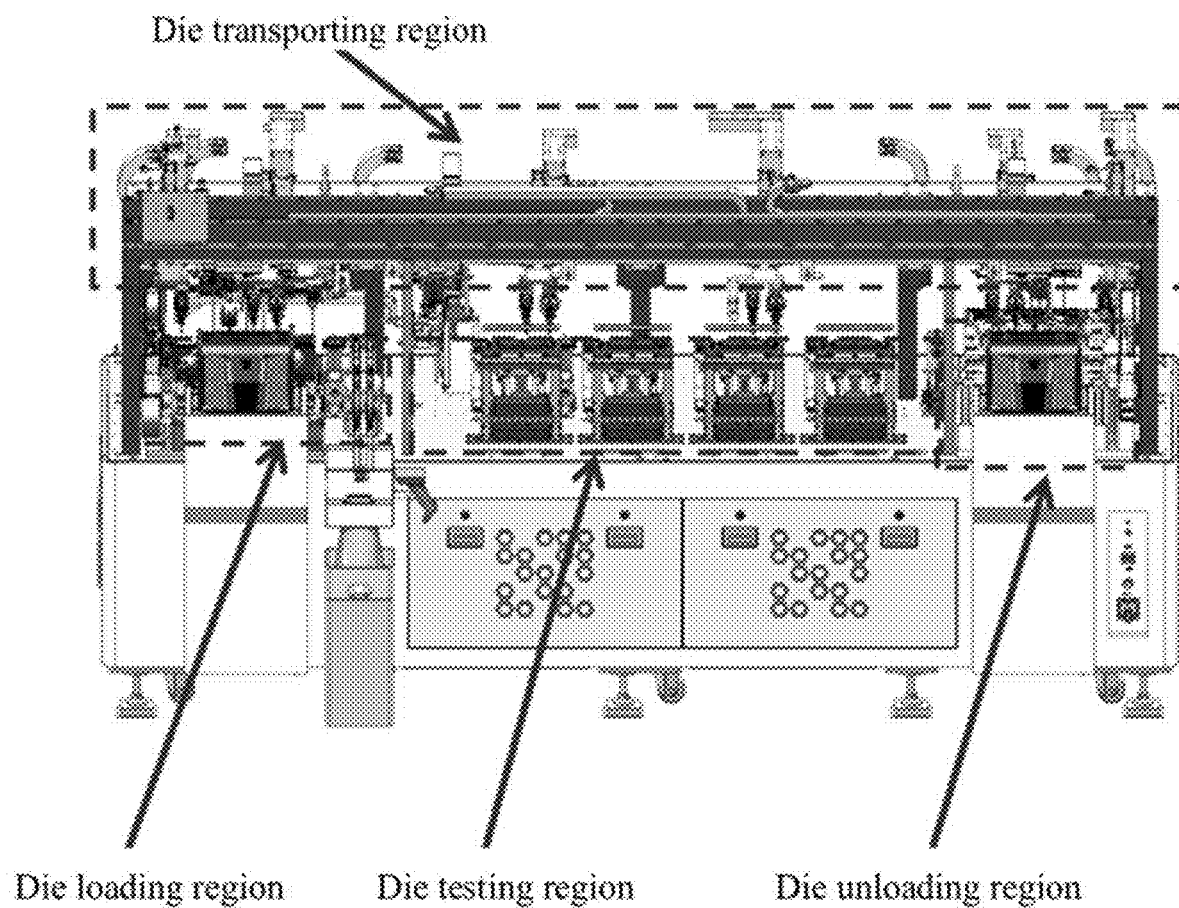
FIG. 7A illustrates a structural schematic of an exemplary die testing apparatus.
Figure 7B:
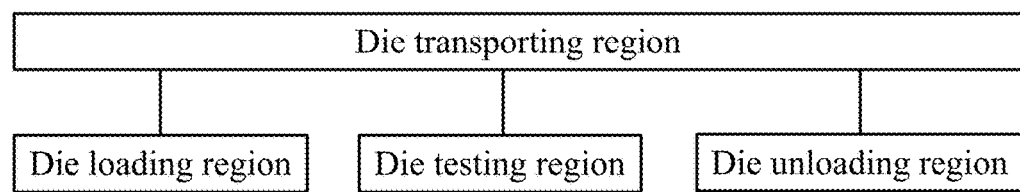
FIG. 7B illustrates a structural block diagram of the exemplary die testing apparatus in FIG. 7A.
Figure 8:
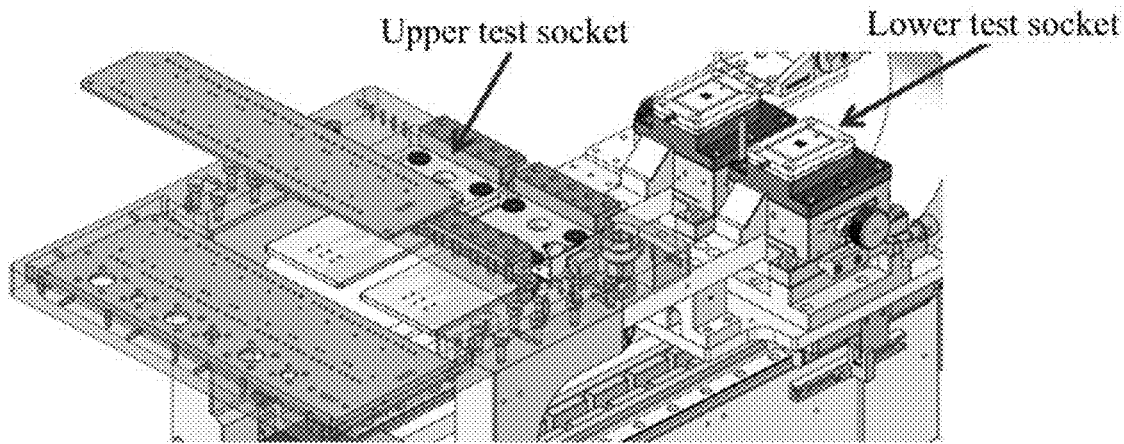
FIG. 8 illustrates a structural schematic of a die testing region of an exemplary die testing apparatus.

The main structure of the die testing apparatus (machine) may include four regions, that is, a die automatic loading region, a die transporting region, a die testing region and a die unloading region, as shown in FIGS. 7A-7B. Referring to FIGS. 7A-7B and 8, FIG. 7A illustrates a structural schematic of an exemplary die testing apparatus; FIG. 7B illustrates a structural block diagram of the exemplary die testing apparatus in FIG. 7A; and FIG. 8 illustrates a structural schematic of a die testing region of the exemplary die testing apparatus. The die test pressing-down apparatus may be configured in the die testing region of FIGS. 7A-7B and 8.

The automatic die loading region may be configured for wafer loading, die positioning, die stripping and die picking; or automatically pick up the dies from a tape reel, and adapt to wafers of different sizes. The die transporting region may be configured for picking up dies by suction and transporting dies between different test stations. The die testing region may be configured for die position correction, temperature control and testing of different projects. The die testing region may be set up with multiple stations to support multi-station parallel testing or serial testing, and different test projects. The die unloading region may be configured for appearance inspection and unloading to different bins after the die testing is completed, so that dies may be tested and classified into different die bins. In the die automatic loading region, a conventional die loading apparatus may be utilized.

In the die transporting region, an imported high-speed linear motor may be utilized to ensure die transporting speed and stability. The main improvement lies in the suction nozzle transporting apparatus of the die. The suction nozzle transporting apparatus may include six sets of sub-suction-nozzle transporting apparatuses, which may operate in parallel without interfering with each other. Each set of sub-suction-nozzle transporting apparatus may include two suction nozzles which may suck two dies simultaneously. Each set of suction nozzles may be positioned independently to facilitate quick switching between different products. The suction nozzle may support temperature control and be preheated at high temperatures. The specially designed nozzle may avoid contact with the critical regions of the dies and reduce the risk of crushing injuries. The pressure of the suction nozzle to suck the dies may be adjustable to avoid improper suction or crushing of die surfaces. The suction nozzle may be disposed with a vacuum pressure sensor. By adjusting a vacuum pressure value, the adsorption strength of the suction nozzle may be ensured to prevent dies from falling during suction and transporting processes.

Referring to FIG. 8, in the die testing region, two dies on the suction nozzle may place materials (dies) to the calibration platform simultaneously. Two dies may perform position calibration simultaneously to reduce calibration time. Two sets of upper test sockets may be installed on a connection board, and each set of sockets may be switched and powered through a signal switch. A high-temperature nitrogen interface may be reserved on the socket of each set. Two sets of lower test sockets may be installed on a test carrier, each reserving two sets of temperature control interfaces. The upper and lower test sockets may be independent of each other, making position correction and maintenance more convenient. The lower test socket may be mounted on a high-speed linear motor and may quickly switch between a loading position and a testing position. A CCD (charge coupled device) may be disposed above a testing site to visually identify whether the die is correctly placed on the testing site. The testing site may be equipped with a vacuum pressure detection system. By determining a pressure value of a sucked die, whether the die is correctly placed on the site and whether there are any abnormalities such as warping may be determined, thereby ensuring that the die is correctly placed on the testing site and preventing warping or flipping.

In the die unloading region, a conventional material (die and/or wafer) unloading apparatus may be applied. An unloading station may be equipped with material (wafer/die) box in-situ detection to prevent unloading failure or abnormality due to that the material box is not empty in the unloading station or the material box is not in a safe position. A large-view CCD may be installed at the unloading station, which may monitor in real time whether an angle and a spacing of the die after being placed in the blue film are abnormal.

Exemplary Embodiment Three

Figure 9:
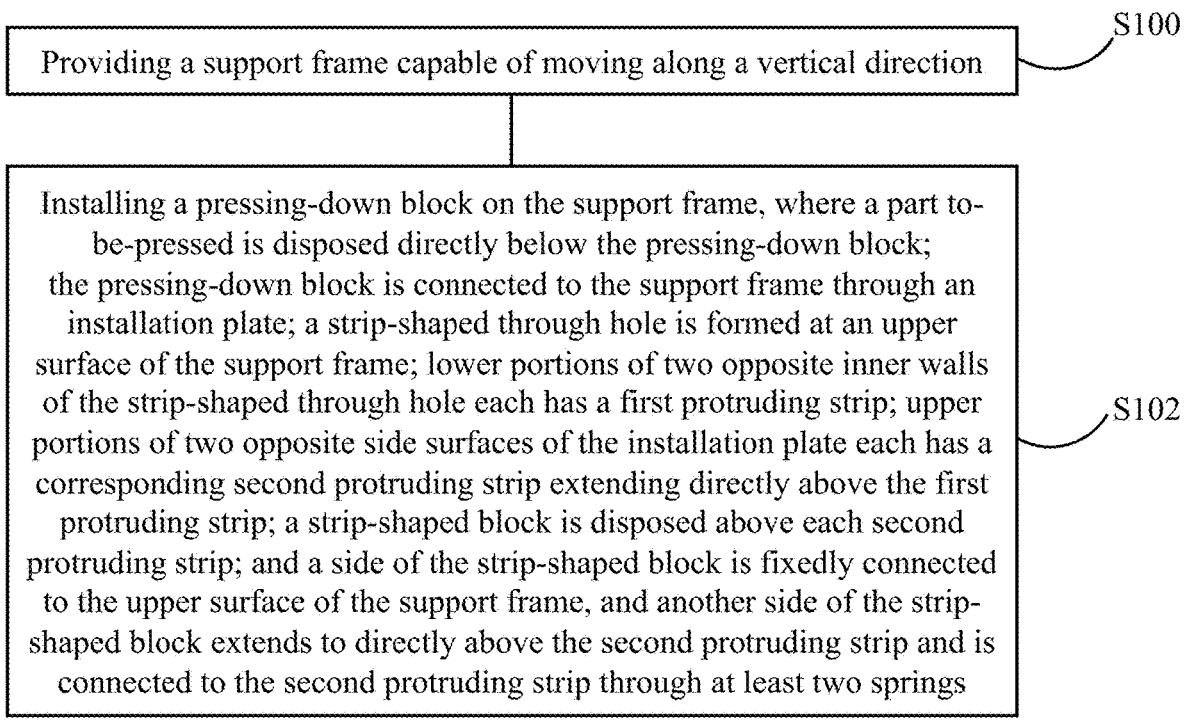
FIG. 9 illustrates a flowchart of a formation method of a die test pressing-down apparatus according to various embodiments of the present disclosure.

The present disclosure provides a formation method of the die test pressing-down apparatus. FIG. 9 illustrates a flowchart of the formation method of the die test pressing-down apparatus according to various embodiments of the present disclosure. Referring to FIG. 9, the formation method may include following exemplary steps.

At S100, the support frame 1 capable of moving along the vertical direction is provided.

At S102, the pressing-down block 3 is installed on the support frame 1, where the part to-be-pressed 4 is disposed directly below the pressing-down block 3.

The part to-be-pressed 4 may be disposed directly below the pressing-down block 3. The pressing-down block 3 may be connected to the support frame 1 through the installation plate 5. The strip-shaped through hole 6 may be formed on the upper surface of the support frame 1. The first protruding strip 71 may be at each of lower portions of two opposite inner walls of the strip-shaped through hole 6. A corresponding second protruding strip 72 extending directly above the first protruding strip 71 may be at each of upper portions of two opposite side surfaces of the installation plate 5. The strip-shaped block 8 may be disposed above each second protruding strip 72. A side of the strip-shaped block 8 may be fixedly connected to the upper surface of the support frame 1, and another side of the strip-shaped block 8 may extend to directly above the second protruding strip 72 and be connected to the second protruding strip 72 through at least two springs 9.

When the pressing-down block 3 and the part to-be-pressed 4 are spaced apart from each other, the lower surface of the second protruding strip 72 may be adjoined to be in contact with the upper surface of corresponding first protruding strip 71. When the lower surface of the pressing-down block 3 is tightly pressed with the upper surface of the part to-be-pressed 4, the gap 10 may be formed between the lower surface of the second protruding strip 72 and the upper surface of the first protruding strip 71.

It may be seen from above-mentioned embodiments that the following beneficial effects may be at least achieved.

For the die test pressing-down apparatus in the present disclosure, the strip-shaped through hole may be formed on the upper surface of the support frame; the first protruding strip maybe at each of lower portions of two opposite inner walls of the strip-shaped through hole; a corresponding second protruding strip extending directly above the first protruding strip may be at each of upper portions of two opposite side surfaces of the installation plate; the strip-shaped block may be disposed above each second protruding strip; and a side of the strip-shaped block may be fixedly connected to the upper surface of the support frame, and another side of the strip-shaped block may extend to directly above the second protruding strip and be connected to the second protruding strip through at least two springs. When the pressing-down block and the part to-be-pressed are spaced apart from each other, the lower surface of the second protruding strip may be adjoined to be in contact with the upper surface of corresponding first protruding strip. When the lower surface of the pressing-down block is tightly pressed with the upper surface of the part to-be-pressed, the gap may be formed between the lower surface of the second protruding strip and the upper surface of the first protruding strip. The horizontal reference of the pressing-down block may be converted to the part to-be-pressed after the pressing-down block is molded together with the part to-be-pressed; and the springs may absorb and balance the slight deviation on the horizontal plane, thereby ensuring a flat contact or attachment between the pressing-down block and the part to-be-pressed and further improving the mold closing flatness between the pressing-down block and the part to-be-pressed.

Above-mentioned embodiments may be only for illustrating technical concepts and features of the present disclosure. The purpose may be to make those skilled in the art understand the content of the present disclosure and implement the present disclosure accordingly and may not limit the protection scope of the present disclosure. All equivalent changes or modifications made based on the spirit and essence of the present disclosure shall be included in the protection scope of the present disclosure.

What is claimed is:

1. A die test pressing-down apparatus, comprising:
   a support frame capable of moving along a vertical direction; and
   a pressing-down block installed on the support frame, wherein a part to-be-pressed is disposed directly below the pressing-down block, wherein:
   the pressing-down block is connected to the support frame through an installation plate; a strip-shaped through hole is formed at an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs; and
   when the pressing-down block and the part to-be-pressed are spaced apart from each other, a lower surface of the second protruding strip is adjoined to be in a contact with an upper surface of a corresponding first protruding strip; and when a lower surface of the pressing-down block is tightly pressed with an upper surface of the part to-be-pressed, a gap is formed between the lower surface of the second protruding strip and the upper surface of the corresponding first protruding strip.

2. The die test pressing-down apparatus according to claim 1, wherein:
   each second protruding strip is connected to the strip-shaped block by a quantity of 4 to 8 springs arranged at an equal interval along a length direction of the strip-shaped block.

3. The die test pressing-down apparatus according to claim 1, wherein:
   an installation groove for an end portion of a spring to be inserted is formed at an upper surface of the second protruding strip and/or at a lower surface of the strip-shaped block.

4. The die test pressing-down apparatus according to claim 1, wherein:
   the strip-shaped through hole is formed at a horizontal portion of the support frame; and
   a vertical portion of the support frame is installed on a surface of a side of an installation base plate, which is vertically configured, through at least two sets of vertical guiding rails and vertical sliding blocks matched with each other.

5. The die test pressing-down apparatus according to claim 4, wherein:
   the horizontal portion of the support frame is at an upper end of the vertical portion and extends to another side of the installation base plate.

6. The die test pressing-down apparatus according to claim 1, wherein:
   the pressing-down block and the part to-be-pressed are matched to be connected to each other through at least two sets of pins and pin holes.

7. The die test pressing-down apparatus according to claim 1, wherein:
   the pressing-down block is fixedly installed on a lower surface of the installation plate.

* * * * *